United States Patent
Gohira et al.

(10) Patent No.: US 10,811,275 B2
(45) Date of Patent: Oct. 20, 2020

(54) PLASMA ETCHING METHOD AND PLASMA ETCHING APPARATUS

(71) Applicant: Tokyo Electron Limited, Tokyo (JP)

(72) Inventors: Taku Gohira, Miyagi (JP); Yuya Minoura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/275,496

(22) Filed: Feb. 14, 2019

(65) Prior Publication Data

US 2019/0252203 A1  Aug. 15, 2019

(30) Foreign Application Priority Data

Feb. 15, 2018  (JP) .................................. 2018-024761
Nov. 15, 2018  (JP) .................................. 2018-214584

(51) Int. Cl.
| | | |
|---|---|---|
| *H01L 21/311* | (2006.01) | |
| *H01L 21/67* | (2006.01) | |
| *H01J 37/00* | (2006.01) | |
| H01L 21/683 | (2006.01) | |

(52) U.S. Cl.
CPC ........ *H01L 21/31116* (2013.01); *H01J 37/00* (2013.01); *H01L 21/67069* (2013.01); *H01L 21/31144* (2013.01); *H01L 21/6831* (2013.01)

(58) Field of Classification Search
CPC ......... H01L 21/31116; H01L 21/67069; H01L 21/6831; H01L 21/31144; H01J 37/00; H01J 37/32449; H01J 37/32724
See application file for complete search history.

(56) References Cited

U.S. PATENT DOCUMENTS

2018/0204728 A1*  7/2018  Oomori ............... H01L 21/3065
2019/0131135 A1*  5/2019  Belau .................. H01L 21/3065

FOREIGN PATENT DOCUMENTS

| JP | 2016-122774 A | 7/2016 | |
|---|---|---|---|
| WO | WO-2017026197 A1 * | 2/2017 | ........ H01L 21/31116 |

* cited by examiner

*Primary Examiner* — Nadine G Norton
*Assistant Examiner* — Mahmoud Dahimene
(74) *Attorney, Agent, or Firm* — Pearne & Gordon LLP

(57) ABSTRACT

Bending of a hole or a groove formed in a multilayered film including silicon oxide films and silicon nitride films alternately stacked on top of each other is suppressed. A plasma etching method includes a first etching process of etching, by plasma, the multilayered film including the silicon oxide films and the silicon nitride films alternately stacked on top of each other; and a second etching process of etching, by plasma, the multilayered film under a processing condition that an inclination of a portion of an inner sidewall of the hole or the groove, which is formed by the etching of the multilayered film, corresponding to the silicon nitride film with respect to a depth direction of the hole or the groove is reduced.

15 Claims, 12 Drawing Sheets

PLASMA ETCHING METHOD AND PLASMA ETCHING APPARATUS

CROSS-REFERENCE TO RELATED APPLICATION

This application claims the benefit of Japanese Patent Application Nos. 2018-024761 and 2018-214584 filed on Feb. 15, 2018 and Nov. 15, 2018, respectively, the entire disclosures of which are incorporated herein by reference.

TECHNICAL FIELD

The various aspects and embodiments described herein pertain generally to a plasma etching method and a plasma etching apparatus.

BACKGROUND

Conventionally, there is known a technique of etching a silicon oxide film on a processing target object in a low-temperature environment in which a temperature of the processing target object is maintained at 0° C. or less.

Patent Document 1: Japanese Patent Laid-open Publication No. 2016-122774

SUMMARY

Exemplary embodiments provide a technique capable of suppressing bending of a hole or a groove formed in a multilayered film including silicon oxide films and silicon nitride films alternately stacked on top of each other.

In an exemplary embodiment, a plasma etching method includes a first etching process of etching, by plasma, a multilayered film including silicon oxide films and silicon nitride films alternately stacked on top of each other; and a second etching process of etching, by plasma, the multilayered film under a processing condition that an inclination of a portion of an inner sidewall of a hole or a groove, which is formed by the etching of the multilayered film, corresponding to the silicon nitride film with respect to a depth direction of the hole or the groove is reduced.

According to the exemplary embodiment, it is possible to suppress the bending of the hole or the groove formed in the multilayered film including the silicon oxide films and the silicon nitride films alternately stacked on top of each other.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
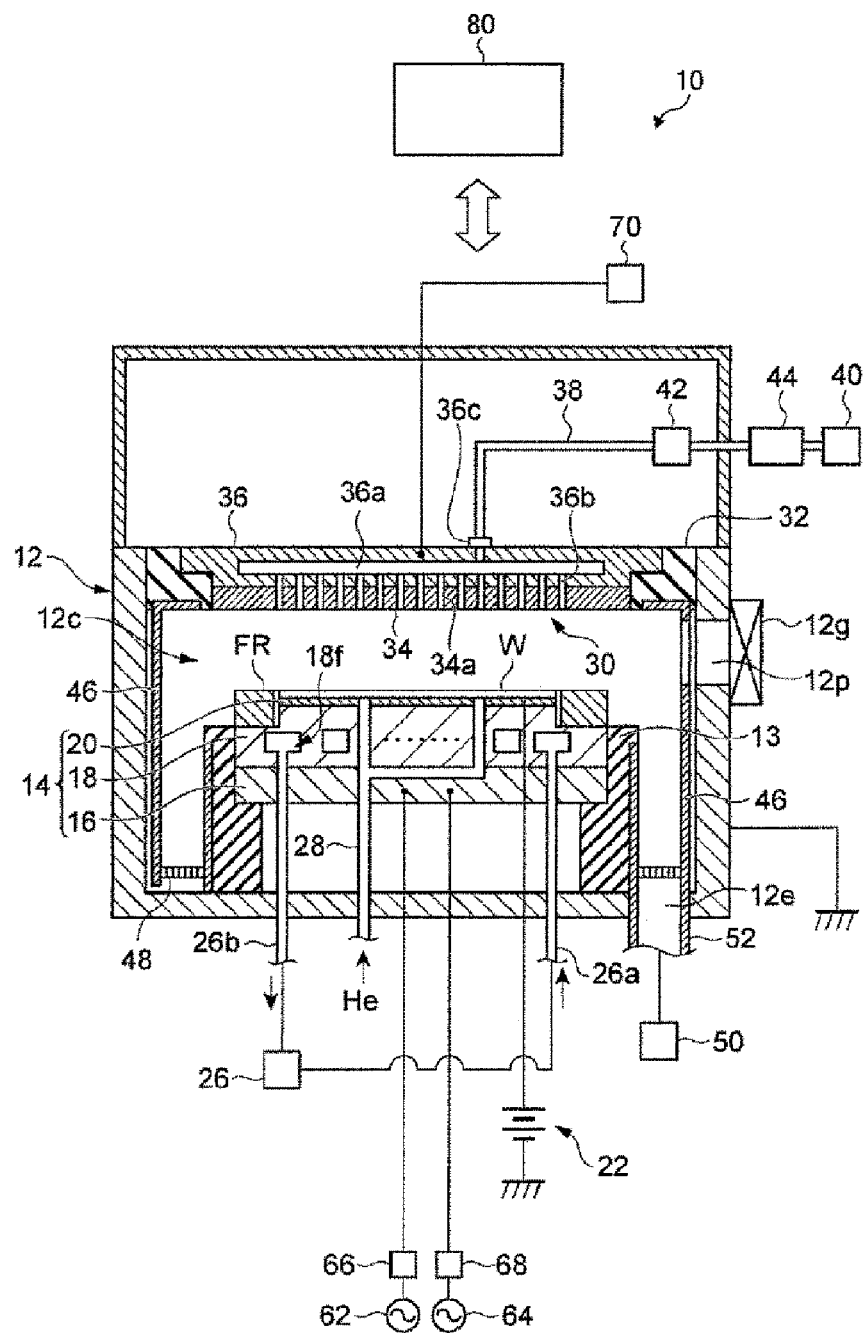
FIG. 1 is a longitudinal cross sectional view illustrating an example of a plasma etching apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a plasma etching method and a plasma etching apparatus according to an exemplary embodiment will be described with reference to the accompanying drawings. However, it should be noted that the exemplary embodiment is not limiting.

Conventionally, there is known a technique of etching a silicon oxide film on a processing target object in a low-temperature environment in which a temperature of the processing target object is maintained at 0° C. or less.

In case of etching a multilayered film composed of silicon oxide films and silicon nitride films alternately stacked on top of each other, there is a concern that a bending in which a formed hole or groove is bent may occur. For example, when etching the multilayered film in the aforementioned low-temperature environment, the degree of bending of the hole or groove formed in the multilayered film is increased, resulting in degradation of verticality of the hole or groove. In this regard, it is required to suppress the bending of the hole or groove formed in the multilayered film.

[Configuration of Plasma Etching Apparatus 10]

FIG. 1 is a longitudinal cross sectional view illustrating an example of a plasma etching apparatus 10 according to an exemplary embodiment. The plasma etching apparatus 10 shown in FIG. 1 is a capacitively coupled plasma etching apparatus. The plasma etching apparatus 10 is equipped with a chamber 12. The chamber 12 has a substantially cylindrical shape. An internal space of the chamber 12 is configured as a processing space 12c. The chamber 12 is made of, by way of example, aluminum. An inner wall surface of the chamber 12 is processed to have plasma-resistance. By way of example, the inner wall surface of the chamber 12 is anodically oxidized. The chamber 12 is electrically grounded.

A passage 12p is formed at a sidewall of the chamber 12. When a wafer W as an example of a processing target object is carried into the processing space 12c or carried out of the processing space 12c, the wafer W passes through this passage 12p. This passage 12p is opened or closed by a gate valve 12g.

A supporting member 13 is provided on a bottom portion of the chamber 12. The supporting member 13 is made of an insulating material. The supporting member 13 has a substantially cylindrical shape. Within the processing space 12c, the supporting member 13 is vertically extended upwards from the bottom portion of the chamber 12. The supporting member 13 supports a stage 14. The stage 14 is provided within the processing space 12c.

The stage 14 includes a lower electrode 18 and an electrostatic chuck 20. The stage 14 may further include an electrode plate 16. The electrode plate 16 is made of a conductor such as, but not limited to, aluminum and has a substantially disk shape. The lower electrode 18 is provided on the electrode plate 16. The lower electrode 18 is made of a conductor such as, but not limited to, aluminum and has a substantially disk shape. The lower electrode 18 is electrically connected with the electrode plate 16.

The electrostatic chuck 20 is provided on the lower electrode 18. The wafer W is placed on a top surface of the electrostatic chuck 20. The electrostatic chuck 20 has a main body formed of a dielectric material. A film-shaped electrode is provided within the main body of the electrostatic chuck 20. The electrode of the electrostatic chuck 20 is connected to a DC power supply 22 via a switch. If a voltage is applied to the electrode of the electrostatic chuck 20 from the DC power supply 22, an electrostatic attracting force is generated between the electrostatic chuck 20 and the wafer W. The wafer W is attracted to the electrostatic chuck 20 by the generated electrostatic attracting force to be held by the electrostatic chuck 20.

A focus ring FR is provided on a peripheral portion of the lower electrode 18 to surround an edge of the wafer W. The focus ring FR is configured to improve etching uniformity. The focus ring FR may be made of, but not limited to, silicon, silicon carbide or quartz.

A path 18f is provided within the lower electrode 18. A heat exchange medium (for example, a coolant) is supplied via a pipeline 26a into the path 18f from a chiller unit 26 provided at an outside of the chamber 12. The heat exchange medium supplied into the path 18f is returned back into the chiller unit 26 via a pipeline 26b. In the plasma etching apparatus 10, a temperature of the wafer W placed on the electrostatic chuck 20 is adjusted by a heat exchange between the heat exchange medium and the lower electrode 18.

The plasma etching apparatus 10 is equipped with a gas supply line 28. Through the gas supply line 28, a heat transfer gas, e.g., a He gas from a heat transfer gas supply mechanism is supplied into a gap between the top surface of the electrostatic chuck 20 and a rear surface of the wafer W.

The plasma etching apparatus 10 is further equipped with an upper electrode 30. The upper electrode 30 is provided above the stage 14. The upper electrode 30 is supported at an upper portion of the chamber 12 with a member 32 therebetween. The member 32 is made of a material having insulation property. The upper electrode 30 may include a ceiling plate 34 and a supporting body 36. A bottom surface of the ceiling plate 34 is a surface at a side of the processing space 12c, and it forms and confines the processing space 12c. The ceiling plate 34 may be made of a conductor or semiconductor having low Joule heat. The ceiling plate 34 is provided with multiple gas discharge holes 34a. These gas discharge holes 34a are formed through the ceiling plate 34 in a plate thickness direction.

The supporting body 36 is configured to support the ceiling plate 34 in a detachable manner, and is made of a conductive material such as, but not limited to, aluminum. A gas diffusion space 36a is provided within the supporting body 36. Multiple gas holes 36b are extended downwards from the gas diffusion space 36a to communicate with the multiple gas discharge holes 34a, respectively. Further, the supporting body 36 is provided with a gas inlet port 36c through which a processing gas is introduced into the gas diffusion space 36a. A gas supply line 38 is connected to this gas inlet port 36c.

The gas supply line 38 is connected to a gas source group 40 via a valve group 42 and a flow rate controller group 44. The gas source group 40 includes a plurality of gas sources. The plurality of gas sources include sources of a plurality of gases constituting the processing gas used in a method MT. The valve group 42 includes a plurality of opening/closing valves. The flow rate controller group 44 includes a plurality of flow rate controllers. Each of the flow rate controllers may be a mass flow controller or a pressure control type flow rate controller. Each of the gas sources belonging to the gas source group 40 is connected to the gas supply line 38 via a corresponding valve belonging to the valve group 42 and a corresponding flow rate controller belonging to the flow rate controller group 44.

In the plasma etching apparatus 10, a shield 46 is provided along an inner wall of the chamber 12 in a detachable manner. Further, the shield 46 is also provided on an outer side surface of the supporting member 13. The shield 46 is configured to suppress an etching byproduct from adhering to the chamber 12. The shield 46 may be made of, by way of non-limiting example, an aluminum member coated with ceramic such as $Y_2O_3$.

A baffle plate 48 is provided between the supporting member 13 and the sidewall of the chamber 12. The baffle plate 48 may be made of, by way of example, an aluminum base member coated with ceramic such as $Y_2O_3$. The baffle plate 48 is provided with a plurality of through holes. A gas exhaust port 12e is provided at the bottom portion of the chamber 12 under the baffle plate 48. The gas exhaust port 12e is connected with a gas exhaust device 50 via a gas exhaust line 52. The gas exhaust device 50 has a pressure control valve and a vacuum pump such as a turbo molecular pump.

The plasma etching apparatus 10 is further equipped with a first high frequency power supply 62 and a second high frequency power supply 64. The first high frequency power supply 62 is configured to generate a first high frequency power for plasma generation. A frequency of the first high frequency power is in a range from, e.g., 27 MHz to 100 MHz. The first high frequency power supply 62 is connected to the lower electrode 18 via a matching device 66 and the electrode plate 16. The matching device 66 is equipped with a circuit configured to match an output impedance of the first high frequency power supply 62 and an input impedance at a load side (lower electrode 18 side). Further, the first high frequency power supply 62 may be connected to the upper electrode 30 via the matching device 66.

The second high frequency power supply 64 is configured to generate a second high frequency power for ion attraction into the wafer W. A frequency of the second high frequency power is lower than the frequency of the first high frequency power. The frequency of the second high frequency power falls within a range from, e.g., 400 kHz to 13.56 MHz. The second high frequency power supply 64 is connected to the lower electrode 18 via a matching device 68 and the electrode plate 16. The matching device 68 is equipped with a circuit configured to match an output impedance of the second high frequency power supply 64 and the input impedance at the load side (lower electrode 18 side).

The plasma etching apparatus 10 may further include a DC power supply unit 70. The DC power supply unit 70 is connected to the upper electrode 30. The DC power supply unit 70 is configured to generate a negative DC voltage and apply the generated DC voltage to the upper electrode 30.

The plasma etching apparatus 10 may further include a control unit 80. The control unit 80 may be implemented by a computer including a processor, a storage unit, an input device, a display device, and so forth. The control unit 80 is configured to control individual components of the plasma etching apparatus 10. In the control unit 80, an operator can input commands through the input device to manage the plasma etching apparatus 10. Further, in the control unit 80, an operational status of the plasma etching apparatus 10 can be visually displayed on the display device. Further, the storage unit of the control unit 80 stores therein recipe data and control programs for controlling various processings performed in the plasma etching apparatus 10 by the processor. As the processor of the control unit 80 controls the individual components of the plasma etching apparatus 10 according to the recipe data by executing the control programs, a required processing is performed in the plasma etching apparatus 10.

By way of example, the control unit 80 controls the individual components of the plasma etching apparatus 10 to perform a plasma etching method to be described later. As a specific example, the control unit 80 performs a first etching process of plasma-etching a multilayered film composed of silicon oxide films and silicon nitride films alternately stacked on top of each other. Further, the control unit 80 performs a second etching process of plasma-etching the multilayered film under a processing condition that an inclination of a portion of an inner sidewall of a hole or a groove, which is formed by the etching of the multilayered film, corresponding to the silicon nitride film with respect to a depth direction of the hole or the groove is reduced. Here, for example, the first etching process and the second etching process may be performed in a low-temperature environment where a temperature of the processing target object having thereon the multilayered film is maintained equal to or less than 0° C. Further, the first etching process and the second etching process may be alternately repeated one or more times.

[Structure of Wafer W]

Figure 2:
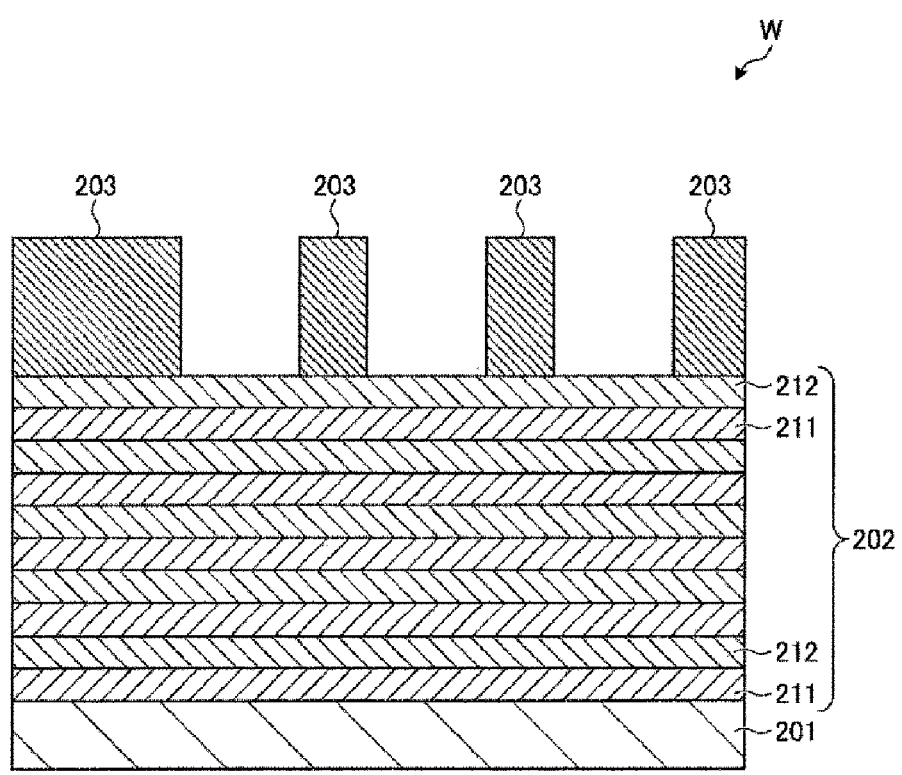
FIG. 2 is a diagram illustrating an example of a structure of a wafer W etched by the plasma etching apparatus according to the exemplary embodiment.

FIG. 2 is a diagram illustrating an example of a structure of the wafer W etched by the plasma etching apparatus 10 according to the exemplary embodiment.

The wafer W has, as depicted in FIG. 2, for example, an ONON film 202 on a silicon substrate 201. Further, a photoresist 203 having openings of a preset pattern is formed on the ONON film 202.

The ONON film 202 is a multilayered film including silicon oxide films 211 and silicon nitride films 212 alternately stacked on top of each other, as shown in FIG. 2, for example. The ONON film 202 includes, e.g., five layers of the silicon oxide films 211 and, e.g., five layers of the silicon nitride films 212. Here, however, it should be noted that the stacking number of the silicon oxide films 211 and the silicon nitride films 212 included in the ONON film 202 is not limited to the shown example but may be more than or less than the stacking number shown in FIG. 2. Further, in FIG. 2, the silicon oxide film 211 is formed on the silicon substrate 201, and the silicon nitride film 212 is formed on the silicon oxide film 211. However, the exemplary embodiment is not limited thereto.

[Plasma Etching Method]

Figure 3:
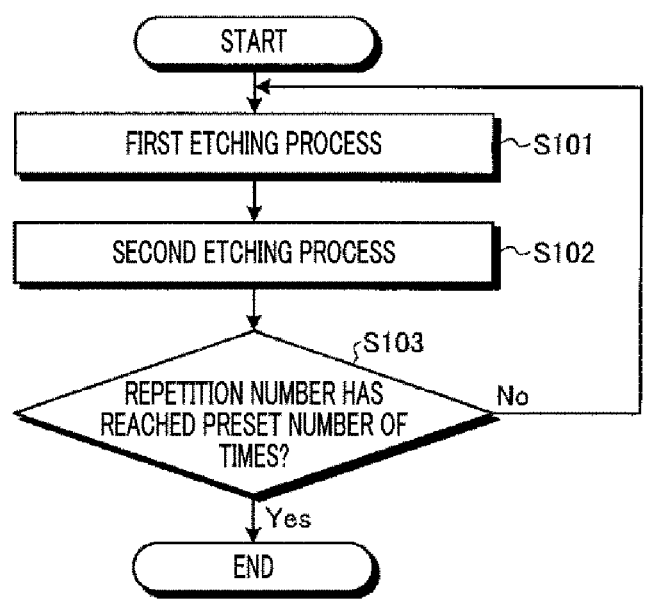
FIG. 3 is a flowchart illustrating an example of a plasma etching method according to the exemplary embodiment.

Now, a plasma etching method according to the present exemplary embodiment will be discussed. FIG. 3 is a flowchart showing an example of the plasma etching method according to the present exemplary embodiment.

In the plasma etching method according to the exemplary embodiment, the wafer W as a processing target object is first carried into the chamber 12 and placed on the stage 14. Then, as the temperature of the coolant flown in the path 18f within the lower electrode 18 of the stage 14 is adjusted, the temperature of the wafer W placed on the stage 14 is maintained equal to or less than 0° C. Accordingly, subsequent processings (processes S101 and S102) are performed in the low-temperature environment where the temperature of the wafer W is maintained equal to or less than 0° C.

Then, the control unit 80 performs the first etching process of etching the ONON film 202 by plasma (process S101). To elaborate, the control unit 80 supplies a processing gas into the chamber 12 from the gas source group 40 and etches the ONON film 202 by plasma of the processing gas while using the photoresist 203 as a mask.

The control unit 80 performs the first etching process in the process S101 under the following processing conditions, for example.

Pressure within the chamber 12: 3.333 Pa (25 mTorr)

Power level of first high frequency power (40 MHz): 4.5 kW

Power level of second high frequency power (400 kHz): 7 kW

Processing gas: Mixed gas containing $H_2$, $CH_2F_2$, $NF_3$ and HBr

Temperature of wafer: 0° C.

Figure 4:
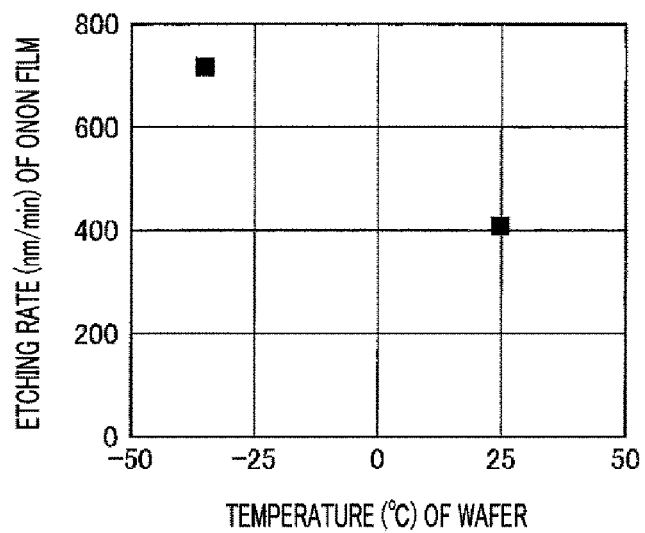
FIG. 4 is a diagram showing a variation of an etching rate of an ONON film when etching the ONON film while changing a temperature of the wafer W.
Figure 5:
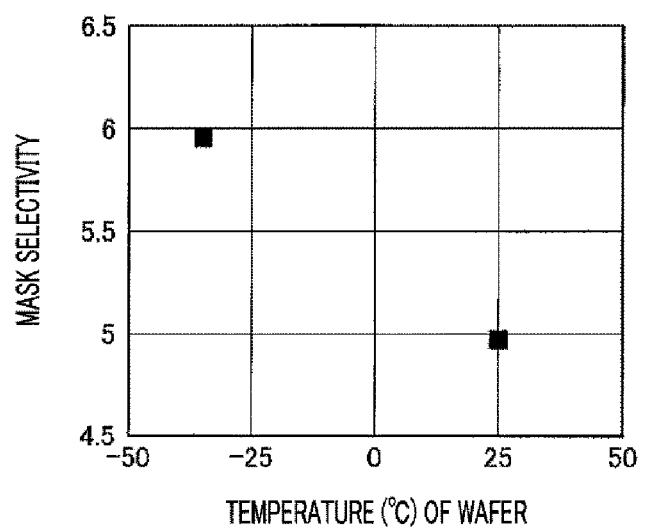
FIG. 5 is a diagram showing a variation of a mask selectivity when etching the ONON film while changing the temperature of the wafer W.
Figure 6:
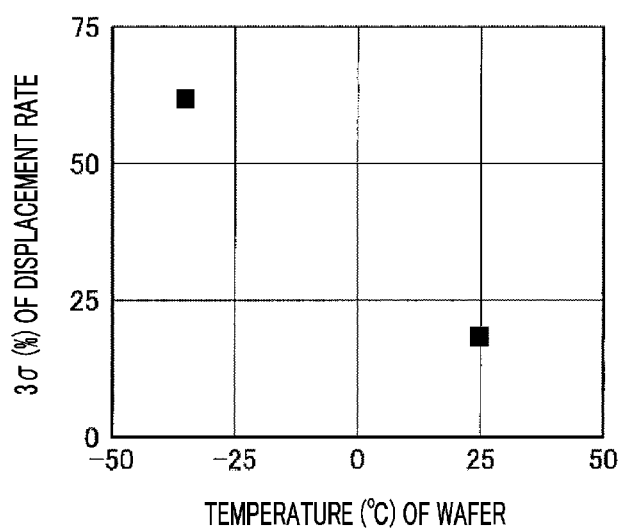
FIG. 6 is a diagram showing a variation of $3\sigma$ of a displacement rate when etching the ONON film while changing the temperature of the wafer W.

Here, a result of an experiment where the ONON film 202 is etched while changing the temperature of the wafer W will be explained with reference to FIG. 4 to FIG. 6. FIG. 4 is a diagram showing a variation of an etching rate of the ONON film 202 when etching the ONON film 202 while changing the temperature of the wafer W. FIG. 5 is a diagram showing a variation of a mask selectivity when etching the ONON film 202 while changing the temperature of the wafer W. FIG. 6 is a diagram showing a variation of 3σ of a displacement rate when etching the ONON film 202 while changing the temperature of the wafer W.

Further, in FIG. 5, the mask electivity is a value obtained by dividing the etching rate of the ONON film 202 by an etching rate of the photoresist 203. A larger value of the mask selectivity indicates that a larger amount of the photoresist 203 is left after the etching, whereas a smaller value of the mask selectivity implies that a smaller amount of the photoresist 203 is left after the etching.

In FIG. 6, the displacement rate is defined by the following expression (1).

$$\text{Displacement rate } (\%) = (Q-P)/P \times 100 \quad (1)$$

In the expression (1), P denotes a distance between centers of two neighboring openings in the initial photoresist 203; and Q, a distance between centers of bottoms of two holes formed in the ONON film 202 under these two openings by the etching. Further, the 3σ of the displacement rate is a value three times as large as a standard deviation a of the displacement rate. A larger value of the 3σ of the displacement rate indicates that a degree of the bending of the hole is larger, whereas a smaller value of the 3σ of the displacement rate indicates that the degree of the bending of the hole is smaller.

As can be seen from FIG. 4 and FIG. 5, the etching rate of the ONON film 202 and the mask selectivity are found to be increased with the decrease of the temperature of the wafer W. Further, as can be seen from FIG. 6, the 3σ of the displacement rate is found to be increased with the decrease of the temperature of the wafer W. That is, it is found out that the degree of the bending of the hole is increased with the decrease of the temperature of the wafer W, resulting in degradation of the verticality of the hole. The present inventors have conducted an experiment of etching a monolayered silicon oxide film or a monolayered silicon nitride film while changing a temperature of a wafer to investigate why the verticality of the hole formed in the ONON film 202 is deteriorated. In this experiment, the wafer having the monolayered silicon oxide film or the monolayered silicon nitride film is used.

Figure 7:
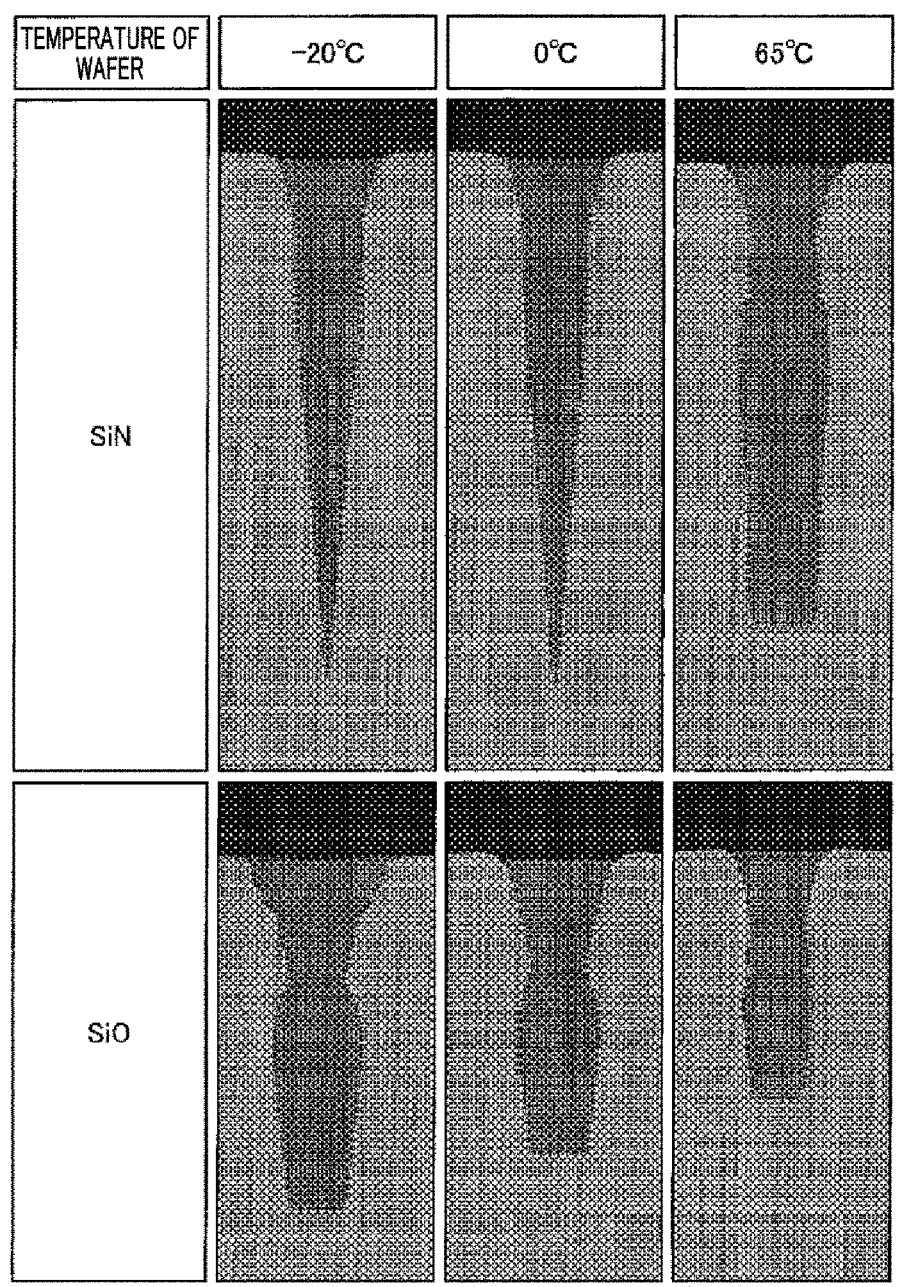
FIG. 7 is a diagram showing an experimental result when etching a monolayered silicon oxide film or a monolayered silicon nitride film while changing a temperature of a wafer.

FIG. 7 is a diagram showing an experimental result when etching the monolayered silicon oxide film or the monolayered silicon nitride film while changing the temperature of the wafer. FIG. 7 shows cross sections of the monolayered silicon oxide film (SiO) and the monolayered silicon nitride film (SiN) etched while changing the temperature of the wafer to −20° C., 0° C. and 65° C.

Referring to the experimental result shown in FIG. 7, the cross section of the hole formed in the monolayered silicon oxide film is found to have a substantially rectangular shape regardless of the temperature of the wafer. Meanwhile, the cross section of the hole formed in the monolayered silicon nitride film is found to have an increasingly narrowing shape in the low-temperature environment where the temperature of the wafer is maintained equal to or less than 0° C. That is to say, in the low-temperature environment where the temperature of the wafer is maintained equal to or less than 0° C., an inner sidewall of the hole formed in the monolayered silicon nitride film is largely inclined. From the experimental result shown in FIG. 7, it is found out that an inclination of a portion of this inner sidewall of the hole, which is formed in the ONON film 202, corresponding to the silicon nitride film 212 with respect to a depth direction of the hole causes the degradation of the verticality of the hole. That is, if the etching of the ONON film 202 progresses in the state that the portion of the inner sidewall of the hole, which is formed in the ONON film 202, corresponding to the silicon nitride film 212 is still inclined with respect to the depth direction of the hole, there is a likelihood that the degree of bending of the hole may be increased.

Reference is made back to FIG. 3. Then, the control unit 80 performs the second etching process of etching the ONON film 202 by plasma under a processing condition that the inclination of the portion of the inner sidewall of the hole, which is formed by the etching of the ONON film 202, corresponding to the silicon nitride film 212 with respect to the depth direction of the hole is reduced (process S102). To elaborate, the control unit 80 supplies a processing gas into the chamber 12 from the gas source group 40 and etches the ONON film 202 by plasma of the processing gas while using the photoresist 203 as the mask. In the processing condition applied to the second etching process, a mixed gas including a hydrogen-containing gas and a fluorine-containing gas is used as the processing gas, for example. The hydrogen-containing gas may be a $H_2$ gas or a hydrocarbon gas such as, but not limited to, a $CH_4$ gas, a $C_2H_6$ gas, a $C_2H_2$ gas, or a $C_3H_6$ gas. The fluorine-containing gas may be, by way of non-limiting example, a $CF_4$ gas, a $NF_3$ gas, a $SF_6$ gas, a $CHF_3$ gas, a $CH_2F_2$ gas, a $C_4F_8$ gas, a HF gas, a $F_2$ gas, or the like. Further, the mixed gas may further include a rare gas. The rare gas may be, by way of example, but not limitation, an Ar gas, a He gas, a Ne gas, a Kr gas, a Xe gas, or the like.

Furthermore, in case that the mixed gas includes the rare gas, it is desirable that, in the mixed gas, a ratio of a flow rate of the rare gas to a sum of flow rates of the hydrogen-containing gas, the fluorine-containing gas and the rare gas is equal to or higher than 33%. Further, in case that the mixed gas includes the rare gas, it is desirable that a ratio of the flow rate of the hydrogen-containing gas to a sum of the flow rates of the hydrogen-containing gas and the fluorine containing gas is in a range from 25% to 90%.

Moreover, the second etching process is begun at a timing which is determined based on a displacement of a center of the bottom of the hole formed in the first etching process with respect to a reference axis passing through a center of the opening of the hole and extended in the depth direction of this hole.

In addition, the mixed gas may include, instead of the rare gas, a dilution gas. The dilution gas may be, for example, at least one of a nitrogen-containing gas, an oxygen-containing gas or a rare gas. The nitrogen-containing gas may be, by way of non-limiting example, a $N_2$ gas. The oxygen-containing gas may be, by way of example, but not limitation, a CO gas, a $CO_2$ gas or an $O_2$ gas. The rare gas may be, for example, an Ar gas, a He gas, a Ne gas, a Kr gas, a Xe gas, or the like. Furthermore, different kinds of rare gases may be used as the dilution gas.

Further, the mixed gas may include, instead of the rare gas, a gas at least containing a halogen other than fluorine.

The gas containing the halogen other than the fluorine needs to contain the halogen other than the fluorine, and may be a gas containing fluorine as well as the halogen other than the fluorine. The gas at least containing the halogen other than the fluorine may be, by way of non-limiting example, a HBr gas, a $Cl_2$ gas, a HCl gas, a HI gas, a $SiCl_4$ gas, a $CF_3I$ gas, a $ClF_3$ gas, a $CF_2Br_2$ gas, a $CCl_4$ gas, or the like.

The control unit 80 performs the second etching process in the process S102 under the following processing conditions, for example.

Pressure within the chamber 12: 3.333 Pa (25 mTorr)
Power level of first high frequency power (40 MHz): 4.5 kW
Power level of second high frequency power (400 kHz): 7 kW
Processing gas: $H_2/CF_4/Ar$
Temperature of wafer: 0° C.

[Relationship Between Addition of Rare Gas and Hole Shape]

Figure 8:
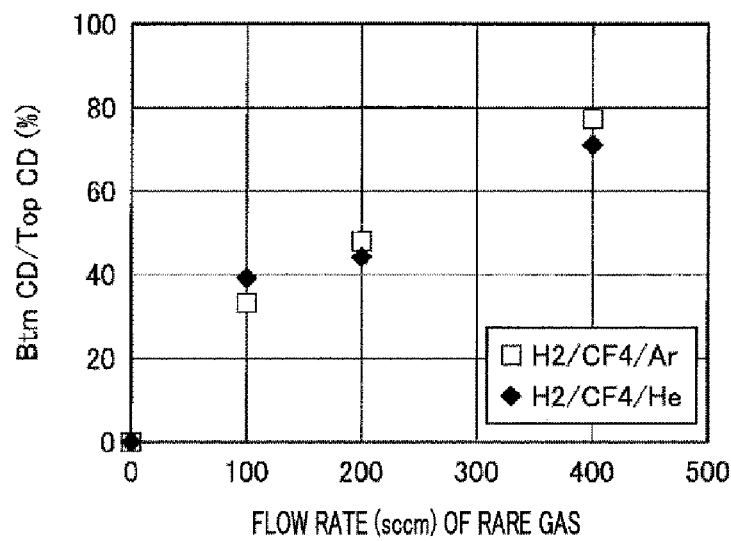
FIG. 8 is a diagram showing a variation of a hole shape when etching a monolayered silicon nitride film by plasma of a mixed gas while changing a flow rate of a rare gas.

Here, an experiment has been conducted to investigate a hole shape when etching a monolayered silicon nitride film by plasma of a mixed gas including a hydrogen-containing gas, a fluorine-containing gas and a rare gas. In this experiment, a $H_2$ gas is used as the hydrogen-containing gas; a $CF_4$ gas is used as the fluorine-containing gas; an Ar gas or a He gas is used as the rare gas; and a flow rate of the rare gas is varied. FIG. 8 is a diagram showing a variation of the hole shape when etching the monolayered silicon nitride film by the plasma of the mixed gas while changing the flow rate of the rare gas. Further, for the comparison of the flow rate conditions, depths of silicon nitride films etched at the individual flow rate conditions are regulated to be same (1100 nm).

In FIG. 8, "Top CD" indicates an opening width of a hole formed in the monolayered silicon nitride film; and "Btm CD" indicates a bottom width of the hole formed in the monolayered silicon nitride film. Further "Btm CD/Top CD" indicates a ratio (%) of "Btm CD" to "Top CD." If a value of the "Btm CD/Top CD" approaches 100%, it implies that a cross sectional shape of the hole becomes closer to a rectangle, whereas if the value of the "Btm CD/Top CD" gets smaller, it indicates that the cross sectional shape of the hole gets narrower.

Further, the experiment of FIG. 8 is conducted mainly under the following conditions except the flow rate of the rare gas.

Pressure within the chamber 12: 3.333 Pa (25 mTorr)
Power level of first high frequency power (40 MHz): 4.5 kW
Power level of second high frequency power (400 kHz): 7 kW
Processing gas and flow rate: $H_2/CF_4/Ar$ or He=150 sccm/50 sccm/0 sccm, 100 sccm, 200 sccm, 400 sccm
Temperature of wafer: 0° C.
Depth of etched silicon nitride film: 1100 nm As can be seen from the experimental result shown in FIG. 8, the value of the "Btm CD/Top CD" is increased with a rise of an addition amount of the rare gas in the mixed gas, so that the cross sectional shape of the hole becomes closer to a rectangle. That is to say, with the increase of the addition amount of the rare gas in the mixed gas, an inclination at the inner sidewall of the hole is decreased. From the experimental result shown in FIG. 8, it is found out that the inclination of the portion of the hole, which is formed in the ONON film 202, corresponding to the silicon nitride film 212 with respect to the depth direction of the hole can be reduced by adding the rare gas to the mixed gas.

[Relationship Between Flow Rate of Rare Gas and Hole Shape]

Figure 9:
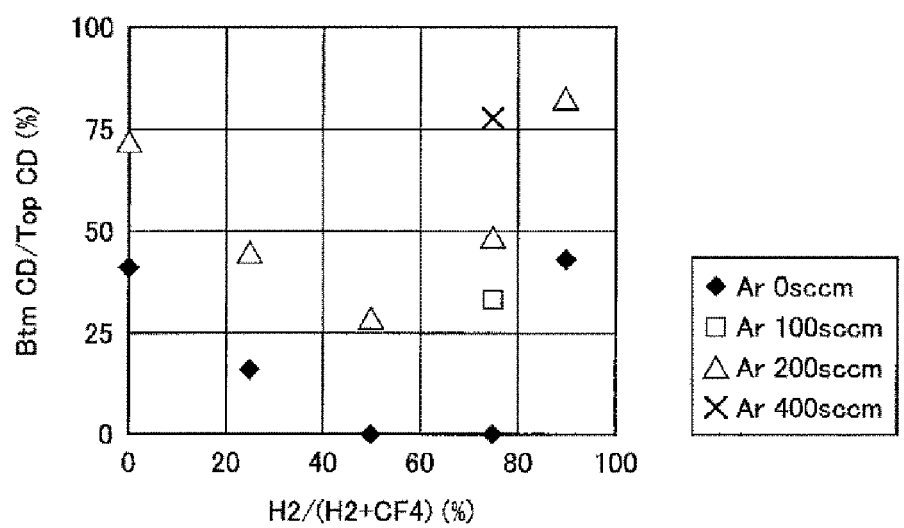
FIG. 9 is a diagram showing a variation of a hole shape when varying a flow rate of a rare gas and a ratio of a flow rate of a hydrogen-containing gas with respect to a sum of flow rates of the hydrogen-containing gas and a fluorine-containing gas.

Then, an experiment has been conducted to investigate a hole shape when changing a flow rate of a rare gas and a ratio of a flow rate of a hydrogen-containing gas to a sum of the flow rate of the hydrogen-containing gas and a flow rate of a fluorine-containing gas. In this experiment, a $H_2$ gas is used as the hydrogen-containing gas; a $CF_4$ gas is used as the fluorine-containing gas; an Ar gas or a He gas is used as the rare gas; and the flow rate of the rare gas is varied. Further, in the experiment, the ratio of the flow rate of the hydrogen-containing gas to the sum of the flow rates of the hydrogen-containing gas and the fluorine-containing gas is varied. FIG. 9 is a diagram showing a variation of the hole shape when changing the flow rate of the rare gas and the ratio of the flow rate of the hydrogen-containing gas to the sum of the flow rates of the hydrogen-containing gas and the fluorine-containing gas. Further, for the comparison of the flow rate conditions, depths of silicon nitride films etched at the individual flow rate conditions are regulated to be same (1100 nm).

In FIG. 9, "Top CD" indicates an opening width of a hole formed in the monolayered silicon nitride film; and "Btm CD" indicates a bottom width of the hole formed in the monolayered silicon nitride film. Further "Btm CD/Top CD" indicates a ratio (%) of "Btm CD" to "Top CD." If a value of the "Btm CD/Top CD" approaches 100%, it implies that a cross sectional shape of the hole becomes closer to a rectangle, whereas if the value of the "Btm CD/Top CD" approaches 0%, it indicates that the cross sectional shape of the hole gets narrower. Furthermore, "$H_2/(H_2+CF_4)$" denotes a ratio (%) of a flow rate of the $H_2$ gas to a sum of the flow rate of the $H_2$ gas and a flow rate of the $CF_4$ gas.

Further, the experiment of FIG. 9 is conducted mainly under the following conditions except the flow rate of the rare gas and the ratio of the flow rate of the hydrogen-containing gas to the sum of the flow rates of the hydrogen-containing gas and the fluorine-containing gas.

Pressure within the chamber 12: 3.333 Pa (25 mTorr)
Power level of first high frequency power (40 MHz): 4.5 kW
Power level of second high frequency power (400 kHz): 7 kW
Processing gas: $H_2/CF_4/Ar$=50 sccm, 100 sccm, 150 sccm, 180 sccm/150 sccm, 100 sccm, 50 sccm, 20 sccm/0 sccm, 100 sccm (33% when the sum of the flow rates of the $H_2$ gas, the $CF_4$ gas and the Ar gas is set to be 100%), 200 sccm (50% when the sum of the flow rates of the $H_2$ gas, the $CF_4$ gas and the Ar gas is set to be 100%), 400 sccm (66% when the sum of the flow rates of the $H_2$ gas, the $CF_4$ gas and the Ar gas is set to be 100%)
Temperature of wafer: 0° C.
Depth of etched silicon nitride film: 1100 nm As can be seen from the experimental result shown in FIG. 9, when the flow rate of the Ar gas is 0, the "Btm CD/Top CD" has a value of 0% when the "$H_2/(H_2+CF_4)$" is in a range from 50% to 75%, so that the cross section shape of the hole gets narrower.

Meanwhile, when the flow rate of the Ar gas with respect to the sum of the flow rates of the $H_2$ gas, the $CF_4$ gas and the Ar gas is equal to or larger than 33%, the value of the "Btm CD/Top CD" is larger than 0% regardless of the value of the "$H_2/(H_2+CF_4)$", and the cross sectional shape of the hole becomes closer to the rectangle. As a result, it is found out that when the flow rate of the Ar gas with respect to the sum of the flow rates of the $H_2$ gas, the $CF_4$ gas and the Ar gas is equal to or larger than 33%, it is possible to reduce the inclination of the portion of the hole, which is formed in the ONON film 202, corresponding to the silicon nitride film 212 with respect to the depth direction of the hole.

[Relationship Between Flow Rate of Hydrogen-Containing Gas and Etching Rate of ONON Film 202 and Mask Selectivity]

Figure 10:
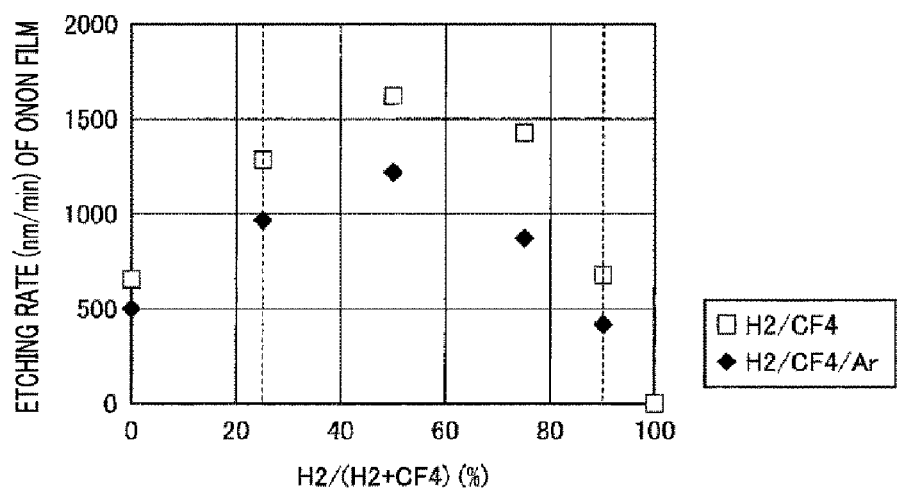
FIG. 10 is a diagram showing a variation of an etching rate of the ONON film when etching the ONON film while changing the ratio of the flow rate of the hydrogen-containing gas with respect to the sum of the flow rates of the hydrogen-containing gas and the fluorine-containing gas.
Figure 11:
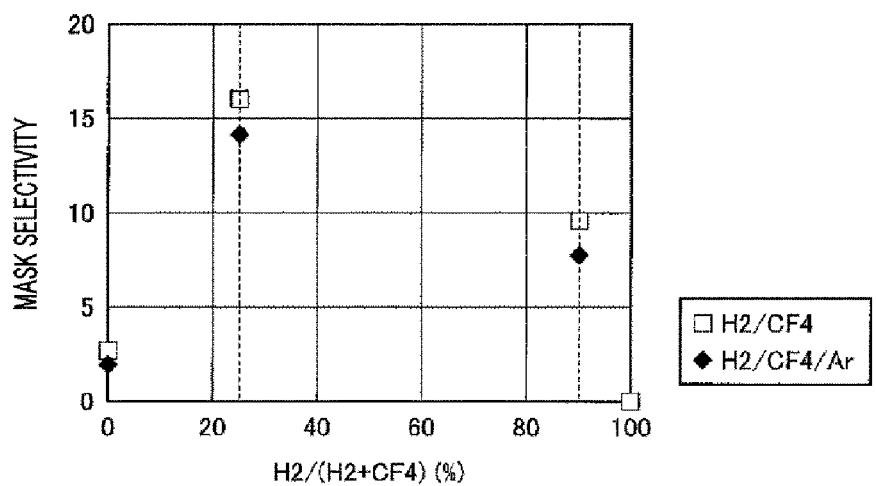
FIG. 11 is a diagram showing a variation of a mask selectivity when etching the ONON film while changing the ratio of the flow rate of the hydrogen-containing gas with respect to the sum of the flow rates of the hydrogen-containing gas and the fluorine-containing gas.

Now, an experimental result obtained when etching the ONON film 202 while changing a ratio of a flow rate of a hydrogen-containing gas to a sum of the flow rate of the hydrogen-containing gas and a flow rate of the fluorine-containing gas will be described with reference to FIG. 10 and FIG. 11. FIG. 10 is a diagram showing a variation of an etching rate of the ONON film 202 when etching the ONON film 202 while changing the ratio of the flow rate of the hydrogen-containing gas to the sum of the flow rates of the hydrogen-containing gas and the fluorine-containing gas. FIG. 11 is a diagram showing a variation of a mask selectivity when etching the ONON film 202 while changing the ratio of the flow rate of the hydrogen-containing gas to the sum of the flow rates of the hydrogen-containing gas and the fluorine-containing gas.

Further, in the experiment shown in FIG. 10 and FIG. 11, a $H_2$ gas is used as the hydrogen-containing gas; a $CF_4$ gas is used as the fluorine-containing gas; and an Ar gas is used as the rare gas. Further, in FIG. 10 and FIG. 11, "$H_2/(H_2+CF_4)$" denotes a ratio (%) of a flow rate of the $H_2$ gas to a sum of the flow rate of the $H_2$ gas and a flow rate of the $CF_4$ gas. Furthermore, in FIG. 11, a mask selectivity is a value obtained by dividing an etching rate of the ONON film 202 by an etching rate of the photoresist 203. The larger the value of the mask selectivity is, the larger the amount of the photoresist 203 left after the etching may be, whereas the smaller the value of the mask selectivity is, the smaller the amount of the photoresist 203 left after the etching may be.

In the experiment of FIG. 10 and FIG. 11, the experiment is conducted mainly under the following conditions except the flow rate of the $H_2$ gas and the flow rate of the $CF_4$.

Pressure within the chamber 12: 3.333 Pa (25 mTorr)
Power level of first high frequency power (40 MHz): 4.5 kW
Power level of second high frequency power (400 kHz): 7 kW
Processing gas and flow rate: $H_2/CF_4/Ar$=50 sccm, 100 sccm, 150 sccm, 180 sccm/150 sccm, 100 sccm, 50 sccm, 20 sccm/0 sccm, 200 sccm
Temperature of wafer: 0° C.

As can be seen from FIG. 10 and FIG. 11, when the "$H_2/(H_2+CF_4)$" is in a range from 25% to 90%, the etching rate of the ONON film 202 and the mask selectivity are maintained at relatively high values even if the Ar gas is added.

[Timing for Starting Second Etching Process]

Figure 12:
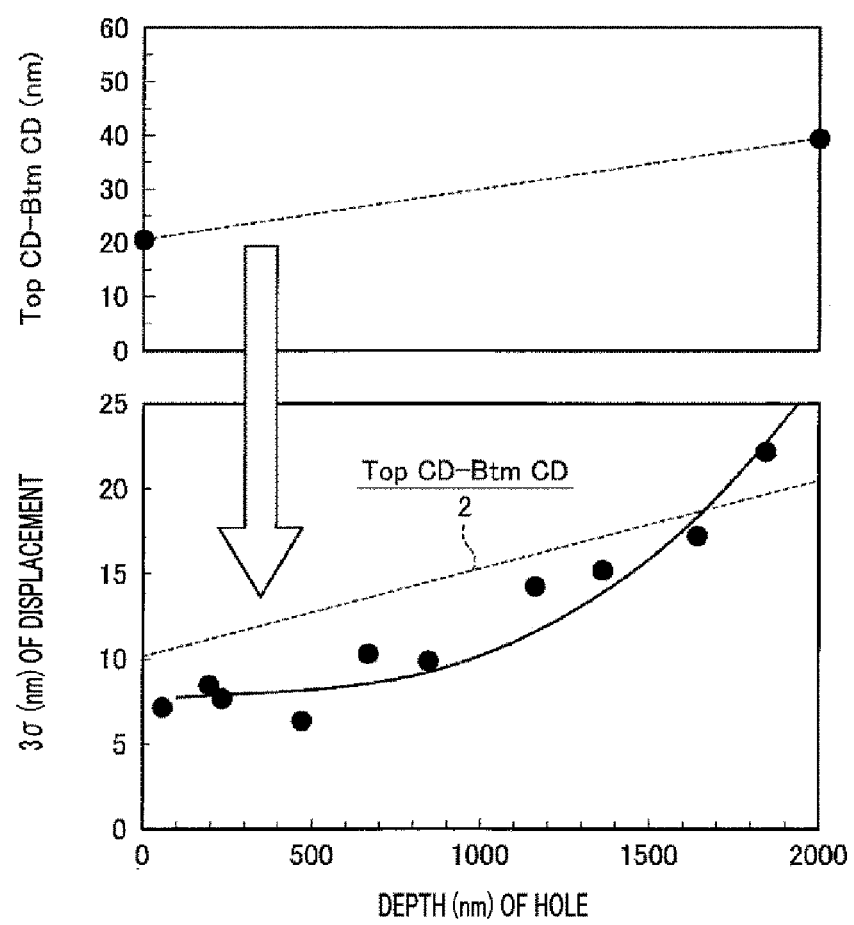
FIG. 12 is a diagram for describing a detail of a timing when a second etching process is begun.

Here, a timing for starting the second etching process will be discussed in further detail. FIG. 12 is a diagram for describing a detail of the timing when the second etching process is begun.

In FIG. 12, "Depth of hole" means a depth (nm) of the hole formed in the ONON film 202 in the first etching process. "Top CD" indicates an opening width (nm) of the hole formed in the ONON film 202 in the first etching process, and "Top CD–Btm CD" denotes a difference between "Top CD" and "Btm CD." Further, "3σ of displacement" indicates 3σ of a displacement of the center of the bottom of the hole formed in the first etching process with respect to the reference axis passing through the center of the opening of the hole and extended in the depth direction of the hole. In FIG. 12, the "3σ of displacement" is indicated by a solid line.

Further, the "displacement" is calculated by the following expression (2).

$$\text{Displacement (nm)}=Q-P \qquad (2)$$

In the expression (2), P denotes the distance between the centers of the two neighboring openings in the initial photoresist 203, and Q denotes a distance between the centers of the bottoms of the two holes formed in the ONON film 202 under these two openings by the etching. Further, the 3σ of the displacement is a value three times as large as a standard deviation a of the displacement.

In the present exemplary embodiment, the second etching process is begun at a timing which is determined based on the displacement of the center of the bottom of the hole with respect to the reference axis passing through the center of the opening of the hole formed in the first etching process and extended in the depth direction of this hole. For example, as shown in FIG. 12, the timing when the second etching process is begun may be a timing when the 3σ of the displacement becomes equal to or less than a half of the "Top CD–Btm CD".

Figure 13:
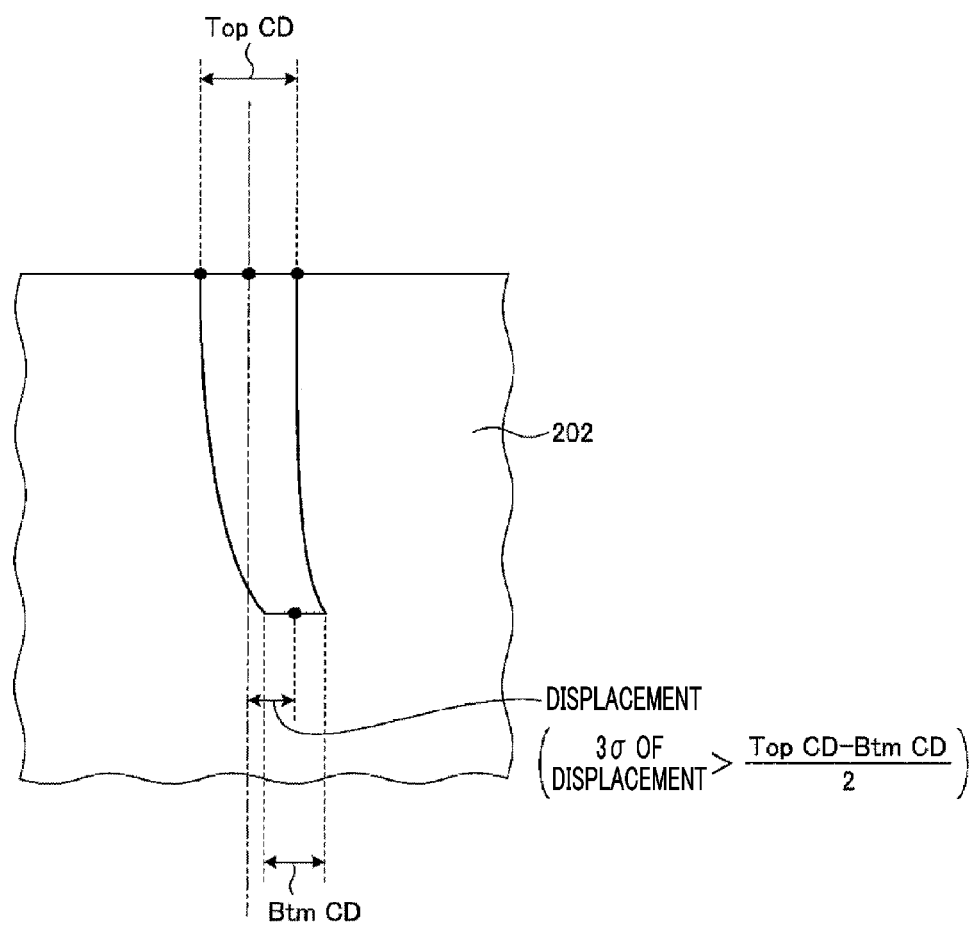
FIG. 13 is a diagram for describing an example of a relationship between a displacement, a Top CD and a Btm CD.
Figure 14:
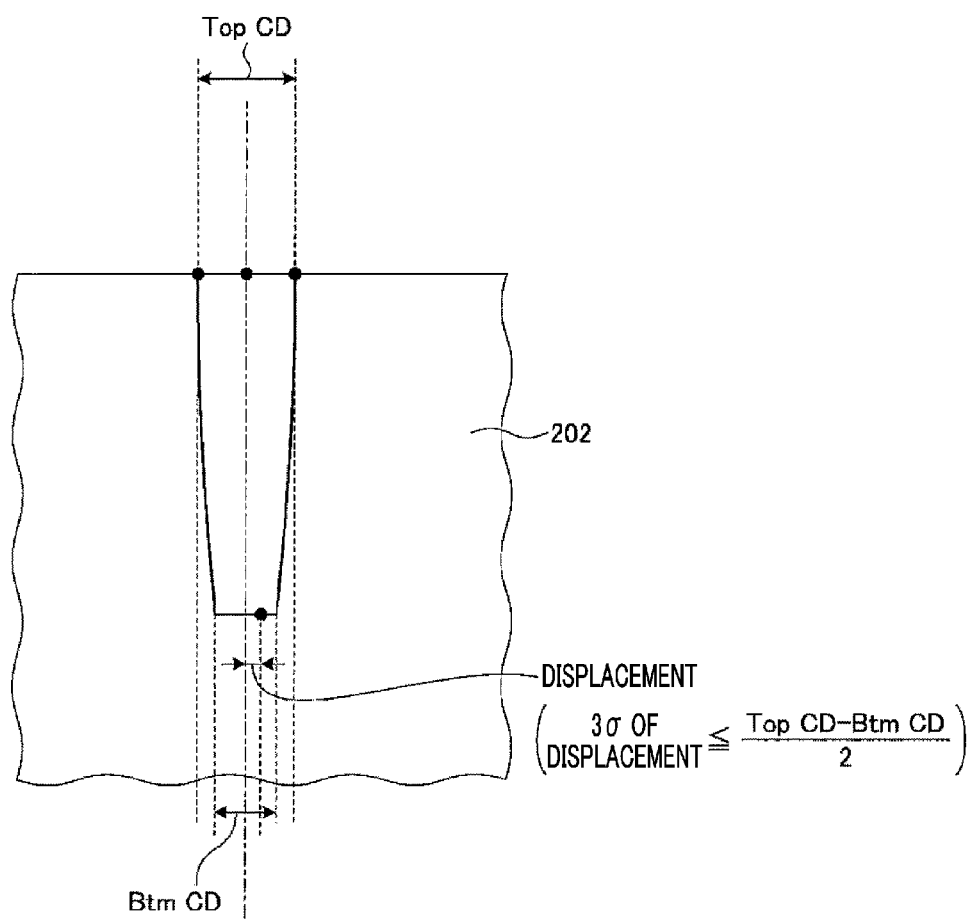
FIG. 14 is a diagram for describing an example of a relationship between a displacement, a Top CD and a Btm CD.

FIG. 13 and FIG. 14 are diagrams for describing an example relationship between the displacement, the Top CD and the Btm CD. If the 3σ of the displacement exceeds the half of the "Top CD–Btm CD", the hole formed in the ONON film 202 is bent as shown in FIG. 13.

Meanwhile, if the 3σ of the displacement is equal to or less than the half of the "Top CD–Btm CD", as shown in FIG. 14, the bending of the hole formed in the ONON film 202 is suppressed as compared to the bending of the hole shown in FIG. 13. That is, as can be seen from FIG. 13 and FIG. 14, by starting the second etching process at the timing when the 3σ of the displacement becomes equal to or less than the half of the "Top CD–Btm CD", the bending of the hole formed in the ONON film 202 is suppressed.

[Relationship Between Addition of Dilution Gas and Hole Shape]

Figure 15:
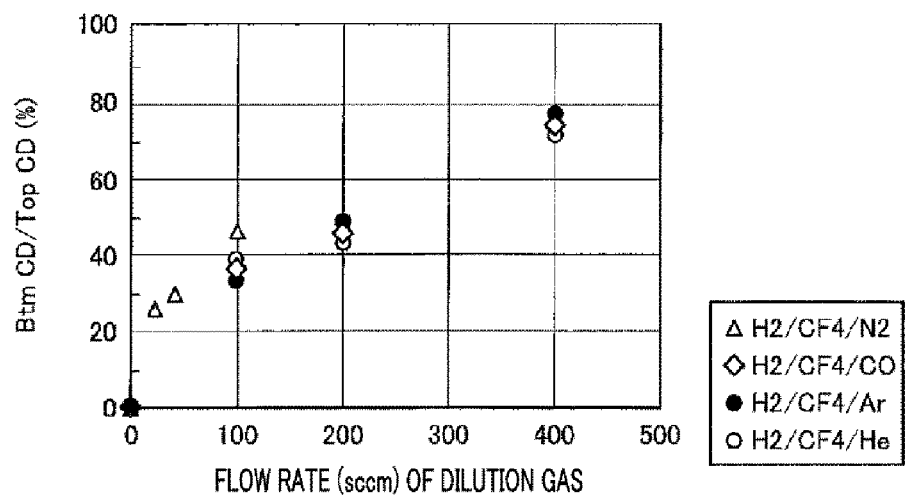
FIG. 15 is a diagram showing a variation of a hole shape when etching a monolayered silicon nitride film by plasma of a mixed gas while varying a flow rate of a dilution gas.

Here, an experiment has been conducted to investigate a hole shape when etching a monolayered silicon nitride film by plasma of a mixed gas including a hydrogen-containing gas, a fluorine-containing gas and a dilution gas. In this experiment, a $H_2$ gas is used as the hydrogen-containing gas; a $CF_4$ gas is used as the fluorine-containing gas; a $N_2$ gas, a CO gas, an Ar gas or a He gas is used as the dilution gas; and a flow rate of the dilution gas is varied. FIG. 15 is a diagram showing a variation of the hole shape when etching the monolayered silicon nitride film by the plasma of the mixed gas while changing the flow rate of the dilution gas. Further, for the comparison of the flow rate conditions, depths of silicon nitride films etched at the individual flow rate conditions are regulated to be same (1100 nm).

In FIG. 15, "Top CD" indicates an opening width of a hole formed in the monolayered silicon nitride film; and "Btm CD" indicates a bottom width of the hole formed in the monolayered silicon nitride film. Further, "Btm CD/Top CD" indicates a ratio (%) of "Btm CD" to "Top CD." If a value of the "Btm CD/Top CD" approaches 100%, it implies that a cross sectional shape of the hole becomes closer to a rectangle, whereas if the value of the "Btm CD/Top CD" gets smaller, it indicates that the cross sectional shape of the hole gets narrower.

Further, the experiment of FIG. 15 is conducted mainly under the following conditions except the flow rate of the dilution gas.

Pressure within the chamber 12: 3.333 Pa (25 mTorr)
Power level of first high frequency power (40 MHz): 4.5 kW
Power level of second high frequency power (400 kHz): 7 kW
Processing gas and flow rates: $H_2/CF_4/N_2$=150 sccm/50 sccm/0, 20, 40, 100 sccm
or $H_2/CF_4/CO$=150 sccm/50 sccm/0, 100, 200, 400 sccm
or $H_2/CF_4/Ar$=150 sccm/50 sccm/0, 100, 200, 400 sccm
or $H_2/CF_4/He$=150 sccm/50 sccm/0, 100, 200, 400 sccm
Temperature of wafer: 0° C.
Depth of etched silicon nitride film: 1100 nm As can be seen from the experimental result shown in FIG. 15, the value of the "Btm CD/Top CD" is increased with a rise of an addition amount of the dilution gas in the mixed gas, so that the cross sectional shape of the hole becomes closer to a rectangle. That is to say, with the increase of the addition amount of the dilution gas in the mixed gas, the inclination at the inner sidewall of the hole is decreased. From the experimental result shown in FIG. 15, it is found out that the inclination of the portion of the hole, which is formed in the ONON film 202, corresponding to the silicon nitride film 212 with respect to the depth direction of the hole can be reduced by adding the dilution gas to the mixed gas.

[Relationship Between Addition of Gas at Least Containing Halogen Other than Fluorine and Hole Shape]

Figure 16:
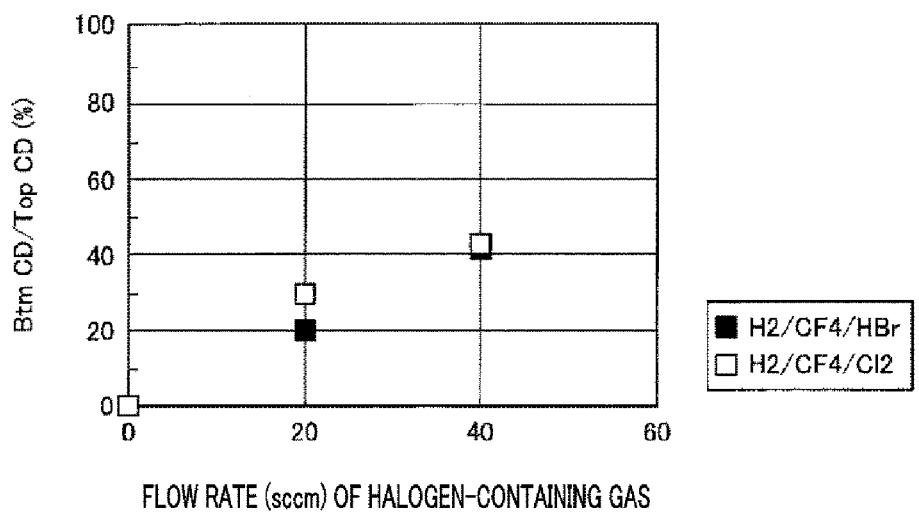
FIG. 16 is a diagram showing a variation of a hole shape when etching a monolayered silicon nitride film by plasma of a mixed gas while varying a flow rate of a halogen-containing gas.

Here, an experiment has been conducted to investigate a hole shape when etching a monolayered silicon nitride film by plasma of a mixed gas containing a hydrogen-containing gas, a fluorine-containing gas and a gas at least containing a halogen other than fluorine (hereinafter, referred to as "halogen-containing gas"). In this experiment, a $H_2$ gas is used as the hydrogen-containing gas; a $CF_4$ gas is used as the fluorine-containing gas; a HBr gas or a $Cl_2$ gas is used as the halogen-containing gas; and a flow rate of the halogen-containing gas is varied. FIG. 16 is a diagram showing a variation of the hole shape when etching the monolayered silicon nitride film by the plasma of the mixed gas while changing the flow rate of the halogen-containing gas. Further, for the comparison of the flow rate conditions, depths of silicon nitride films etched at the individual flow rate conditions are regulated to be same (1100 nm).

In FIG. 16, "Top CD" indicates an opening width of a hole formed in the monolayered silicon nitride film; and "Btm CD" indicates a bottom width of the hole formed in the monolayered silicon nitride film. Further, "Btm CD/Top CD" indicates a ratio (%) of "Btm CD" to "Top CD." If a value of the "Btm CD/Top CD" approaches 100%, it implies that a cross sectional shape of the hole becomes closer to a rectangle, whereas if the value of the "Btm CD/Top CD" gets smaller, it indicates that the cross sectional shape of the hole gets narrower.

Further, the experiment of FIG. 16 is conducted mainly under the following conditions except the flow rate of the halogen-containing gas.

Pressure within the chamber 12: 3.333 Pa (25 mTorr)
Power level of first high frequency power (40 MHz): 4.5 kW
Power level of second high frequency power (400 kHz): 7 kW
Processing gas and flow rates: $H_2/CF_4/HBr$=150 sccm/50 sccm/0, 20, 40 sccm
or $H_2/CF_4/Cl_2$=150 sccm/50 sccm/0, 20, 40 sccm
Temperature of wafer: 0° C.
Depth of etched silicon nitride film: 1100 nm As can be seen from the experimental result shown in FIG. 16, the value of the "Btm CD/Top CD" is increased with a rise of an addition amount of the halogen-containing gas in the mixed gas, so that the cross sectional shape of the hole becomes closer to a rectangle. That is to say, with the increase of the addition amount of the halogen-containing gas in the mixed gas, the inclination at the inner sidewall of the hole is decreased. From the experimental result shown in FIG. 16, it is found out that the inclination of the portion of the hole, which is formed in the ONON film 202, corresponding to the silicon nitride film 212 with respect to the depth direction of the hole can be reduced by adding the halogen-containing gas to the mixed gas Further, in comparison of the experimental result shown in FIG. 16 and the experimental result shown in FIG. 15, it is found out that if the halogen-containing gas is added to the mixed gas, the cross sectional shape of the hole can be made to be closer to the rectangle with a smaller flow rate thereof as compared to the case where the dilution gas is added to the mixed gas. It is deemed to be because if the halogen-containing gas is added to the mixed gas, a deposition amount of a reaction product, which is one of factors causing the cross sectional shape of the hole to be narrowed at the inner sidewall thereof, is reduced, or because the reaction product attached to the inner sidewall of the hole is reduced or removed by the halogen contained in the halogen-containing gas.

Referring back to FIG. 3, the control unit 80 then determines whether a repetition number of the first etching process and the second etching process reaches a preset number of times (process S103). If the repetition number of the first etching process and the second etching process is found not to reach the preset number of times (process S103: No), the control unit 80 returns the processing back to the process S101. Accordingly, the first etching process (process S101) and the second etching process (process S102) are alternately repeated one or more times. Meanwhile, if the repetition number of the first etching process and the second etching process is found to reach the preset number of times (process S103: Yes), the control unit 80 ends the processing.

According to the exemplary embodiment described so far, the ONON film 202 is etched under the conditions that the ONON film 202 is etched down to a portion thereof and, the inclination of the portion of the inner sidewall of the hole, which is formed in the ONON film 202, corresponding to the silicon nitride film 212 with respect to the depth direction of the hole is reduced. Accordingly, it is possible to allow the ONON film 202 to be etched while reducing the inclination which causes the degradation of the verticality of the hole formed in the ONON film 202. As a consequence, the bending of the hole formed in the ONON film 202 can be suppressed.

Further, the above-described exemplary embodiment is not limiting, and various changes and modifications may be made without departing from the scope of the present disclosure.

By way of example, the above exemplary embodiment has been described for the case of forming the hole by etching the ONON film 202, it may be possible to form a groove by etching the ONON film 202.

Further, in the above-described exemplary embodiment, the timing when the second etching process is begun is when the displacement becomes equal to or less than the half of the "Top CD–Btm CD". However, the exemplary embodiment is not limited thereto. For instance, the second etching process may be begun at a timing when the displacement becomes equal to or less than a preset amount (for example, 10 nm).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma etching method, comprising:
a first etching process of etching, by a first plasma of a first processing condition, a multilayered film including silicon oxide films and silicon nitride films alternately stacked on top of each other; and
a second etching process of etching the multilayered film, by a second plasma of a second processing condition that reduces an inclination of a portion of an inner sidewall of a hole or a groove, which was formed by the etching of the multilayered film during the first etching process, corresponding to the silicon nitride film with respect to a depth direction of the hole or the groove,
wherein the second etching process is performed after the first etching process.

2. The plasma etching method of claim 1,
wherein the first etching process and the second etching process are performed in a low-temperature environment where a temperature of a processing target object having thereon the multilayered film is maintained equal to or less than 0° C.

3. The plasma etching method of claim 1,
wherein the second etching process is begun at a timing which is determined based on a displacement of a center of a bottom of the hole or the groove formed in the first etching process with respect to a reference axis passing through a center of an opening of the hole or the groove and extended in the depth direction of the hole or the groove.

4. The plasma etching method of claim 3,
wherein the timing when the second etching process is begun is a timing when $3\sigma$ of the displacement becomes equal to or less than a half of a difference between a width of the opening of the hole or the groove and a width of the bottom of the hole or the groove.

5. The plasma etching method of claim 3,
wherein the timing when the second etching process is begun is a timing when the $3\sigma$ of the displacement becomes equal to or less than 10 nm.

6. The plasma etching method of claim 1,
wherein the first etching process and the second etching process are alternately repeated one or more times.

7. The plasma etching method of claim 1,
wherein a mixed gas including a hydrogen-containing gas and a fluorine-containing gas is used in the second processing condition.

8. The plasma etching method of claim 7,
wherein the mixed gas further includes a rare gas.

9. The plasma etching method of claim 8,
wherein a ratio of a flow rate of the rare gas to a sum of a flow rate of the hydrogen-containing gas, a flow rate of the fluorine-containing gas and the flow rate of the rare gas is equal to or larger than 33%.

10. The plasma etching method of claim 8,
wherein a ratio of a flow rate of the hydrogen-containing gas to a sum of the flow rate of the hydrogen-containing gas and a flow rate of the fluorine-containing gas is in a range from 25% to 90%.

11. The plasma etching method of claim 7,
wherein the mixed gas further includes a dilution gas.

12. The plasma etching method of claim 11,
wherein the dilution gas is at least one of a nitrogen-containing gas, an oxygen-containing gas or a rare gas.

13. The plasma etching method of claim 7,
wherein the mixed gas further includes a gas at least containing a halogen other than fluorine.

14. The plasma etching method of claim 1,
wherein the second processing condition is different from the first processing condition.

15. The plasma etching method of claim 1,
wherein the first processing condition includes supplying a first processing gas,
the second processing condition includes supplying a second processing gas, and
the second processing gas is different from the first processing gas.

* * * * *